United States Patent
Park et al.

(10) Patent No.: US 8,173,469 B2
(45) Date of Patent: May 8, 2012

(54) FABRICATION METHOD OF LIGHT EMITTING DEVICE

(75) Inventors: Kyung Wook Park, Seoul (KR); Myung Hoon Jung, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/050,201

(22) Filed: Mar. 17, 2011

(65) Prior Publication Data

US 2011/0229999 A1    Sep. 22, 2011

(30) Foreign Application Priority Data

Mar. 18, 2010  (KR) ................ 10-2010-0024087

(51) Int. Cl.
*H01L 21/00*    (2006.01)

(52) U.S. Cl. .............. 438/47; 257/12; 257/13; 257/14; 257/88; 257/94; 257/183; 257/615; 257/E21.085; 257/E21.097; 257/E21.108; 257/E21.117; 257/E21.125; 257/E21.172; 257/E21.365; 257/E21.393; 438/28; 438/34; 438/94

(58) Field of Classification Search ............. 257/12, 257/13, 14, 88, 94, 183, 615, E21.085, E21.097, 257/E21.108, E21.117, E21.125, E21.172, 257/E21.365, E21.393; 438/28, 34, 94
See application file for complete search history.

(56) References Cited

U.S. PATENT DOCUMENTS

| | | | | |
|---|---|---|---|---|
| 7,011,706 B2 * | 3/2006 | Higuchi et al. | ................. | 117/89 |
| 7,193,249 B2 | 3/2007 | Seong et al. | .................. | 257/102 |
| 7,358,659 B2 | 4/2008 | Cho | .............................. | 313/498 |
| 7,791,062 B2 | 9/2010 | Lee | ................ | 257/13 |
| 2002/0149028 A1 | 10/2002 | Hori et al. | ..................... | 257/102 |
| 2004/0214362 A1 | 10/2004 | Hill et al. | ......................... | 438/33 |
| 2008/0093608 A1 * | 4/2008 | Chik et al. | ..................... | 257/89 |

FOREIGN PATENT DOCUMENTS

| | | |
|---|---|---|
| JP | 2000-286445 A | 10/2000 |
| JP | 2002-208731 A | 7/2002 |
| JP | 2004-273562 A | 9/2004 |
| JP | 2008-045073 A | 2/2008 |
| KR | 10-2005-0116364 A | 12/2005 |

* cited by examiner

*Primary Examiner* — Asok Sarkar (74) *Attorney, Agent, or Firm* — KED & Associates LLP (57) ABSTRACT

Provided is a method for fabricating a light emitting device. The method for fabricating the light emitting device includes forming a buffer layer including a compound semiconductor in which a rare-earth element is doped on a substrate, forming a light emitting structure including a first conductive type semiconductor layer, an active layer, and a second conductive type semiconductor layer, which are successively stacked on the buffer layer, forming a first electrode layer on the light emitting structure, removing the substrate, and forming a second electrode layer under the light emitting structure.

11 Claims, 12 Drawing Sheets

FABRICATION METHOD OF LIGHT EMITTING DEVICE

The present application claims priority under 35 U.S.C. 119 to Korean Patent Application No. 10-2010-0024087 filed on Mar. 18, 2010, which is hereby incorporated by reference in its entirety.

BACKGROUND

Embodiments relate to a light emitting device and a fabrication method thereof.

A light emitting diode (LED) is a kind of a semiconductor device for converting electric energy into light. The LED has advantages such as low power consumption, a semi-permanent life cycle, a fast response time, safety, and environment friendly compared to the related art light source such as a fluorescent lamp and an incandescent bulb. Many studies are being in progress in order to replace the related art light source with an LED. Also, the LED is being increasingly used according to the trend as light sources for lighting devices such as a variety of lamps used in indoor and outdoor places, liquid crystal display devices, scoreboards, and streetlights.

SUMMARY

Embodiments provide a light emitting device and a fabrication method thereof.

Embodiments also provide a light emitting device having a low price and improved yield and a fabrication method thereof.

In one embodiment, a method for fabricating a light emitting device comprises: forming a buffer layer comprising a compound semiconductor in which a rare-earth element is doped on a substrate; forming a light emitting structure comprising a first conductive type semiconductor layer, an active layer, and a second conductive type semiconductor layer, which are successively stacked on the buffer layer; forming a first electrode layer on the light emitting structure; removing the substrate; and forming a second electrode layer under the light emitting structure.

The details of one or more embodiments are set forth in the accompanying drawings and the description below. Other features will be apparent from the description and drawings, and from the claims.

DETAILED DESCRIPTION OF THE EMBODIMENTS

In the descriptions of embodiments, it will be understood that when a layer (or film), a region, a pattern, or a structure is referred to as being on a substrate, a layer (or film), a region, a pad, or patterns, it can be directly on another layer or substrate, or intervening layers may also be present. Further, it will be understood that when a layer is referred to as being 'under' another layer, it can be directly under another layer, and one or more intervening layers may also be present. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

Hereinafter, embodiments will be described with reference to the accompanying drawings.

FIGS. 1 to 10 are views of a method of fabricating a light emitting device according to an embodiment.

Figure 1:
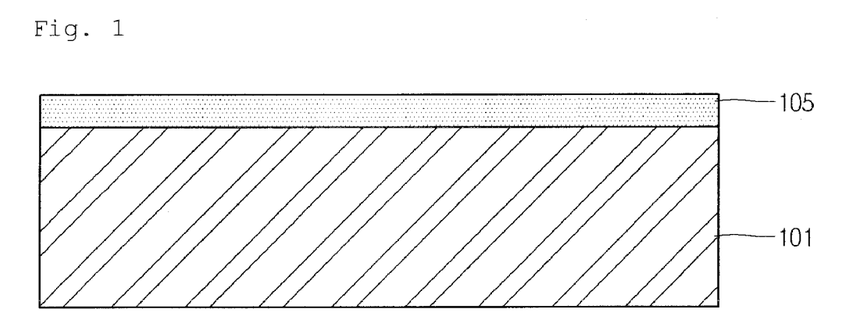
FIGS. 1, 2, 4 to 10 are views of a method of fabricating a light emitting device according to an embodiment.
Figure 2:
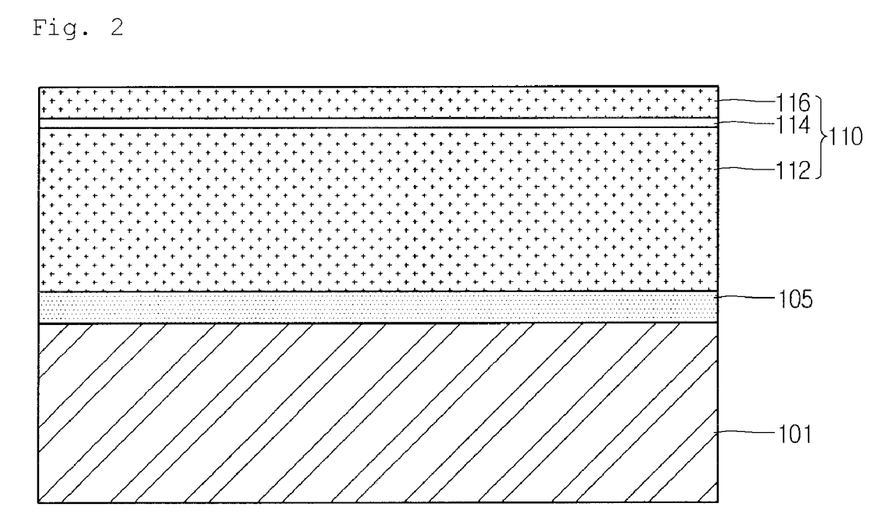

In a method of fabricating a light emitting device according to an embodiment, as shown in FIG. 1, a compound semiconductor layer comprising rare-earth elements is stacked on a substrate 101 to form a buffer layer 105. As shown in FIG. 2, a first conductive type semiconductor layer 112, an active layer 114, and a second conductive type semiconductor layer 116 may be successively stacked on the buffer layer 105 to form a light emitting structure 110.

The substrate 101 may be formed of at least one of sapphire ($Al_2O_3$), SiC, GaN, Si, ZnO, AlN, GaAs, $\beta$-$Ga_2O_3$, GaP, InP, and Ge.

A pattern or inclination may be formed on a top surface of the substrate 101 to accelerate growth of the light emitting structure 110 and improve light emitting efficiency of the light emitting device.

The buffer 105 and the light emitting structure 110 may be grown on the substrate 101. Specifically, the buffer layer 105 and the light emitting structure 110 may be formed using one growth process of a metal organic chemical vapor deposition (MOCVD) process, a chemical vapor deposition (CVD) process, a plasma-enhanced chemical vapor deposition (PECVD) process, a molecular beam epitaxy (MBE) process, and a hydride vapor phase epitaxy (HVPE) process, but is not limited thereto. Also, the buffer layer 105 and the light emitting structure 110 may be formed using the same growth process to improve efficiency of the fabrication process.

For example, the buffer layer 105 may be formed a semiconductor material having a composition formula of $In_xAl_yGa_{1-x-y}N$ ($0 \leq x \leq 1$, $0 \leq y \leq 1$, $0 \leq x+y \leq 1$), e.g., one selected from InAlGaN, GaN, AlGaN, InGaN, AlN, InN, and AlInN. Here, the buffer layer 105 may be doped with a rare-earth element. For example, the rare-earth element may be at least one selected from the group consisting of Eu, Er, Pr, Tb, Dy, Ce, Sm, Gd, Ho, Yb, Lu, Nd, Pm, and Tm.

The buffer layer 105 according to an embodiment may reduce a difference of lattice constant between the light emitting structure 110 and the substrate 101 to allow the light emitting structure 110 to be grown with good crystallinity.

Also, the buffer layer 105 may improve reliability of a laser lift off (LLO) process for removing the substrate 101 in a successive process.

The light emitting structure 110 may be formed on the buffer layer 105. For example, the light emitting structure 110 may comprise the first conductive type semiconductor layer 112, the active layer 114, and the second conductive type semiconductor layer 116 to generate light.

For example, the first conductive type semiconductor layer 112 may comprise an n-type semiconductor layer. The n-type semiconductor layer may be formed of a semiconductor material having a composition formula of $In_xAl_yGa_{1-x-y}N$ ($0 \leq x \leq 1$, $0 \leq y \leq 1$, $0 \leq x+y \leq 1$), e.g., one selected from InAl- GaN, GaN, AlGaN, InGaN, AlInN, AlN, and InN. Here, the n-type semiconductor layer may be doped with an n-type dopant such as Si, Ge, or Sn.

For example, the active layer 114 may be formed of a semiconductor material having a composition formula of $In_xAl_yGa_{1-x-y}N$ ($0 \leq x \leq 1$, $0 \leq y \leq 1$, $0 \leq x+y \leq 1$). The active layer 114 may generate light using energy generated by recombination of electrons and holes provided from the first conductive type semiconductor layer 112 and the second conductive type semiconductor layer 116.

The active layer 114 may have one of a single quantum well structure, a multi quantum well (MQW) structure, a quantum wire structure, and a quantum dot structure. For example, when the active layer 114 has the MQW structure, the active layer 114 may have a period of a well layer and a barrier layer using a compound semiconductor material of a group III-V element, e.g., a period of an InGaN well layer/a GaN barrier layer or a period of an InGaN well layer/a AlGaN barrier layer.

For example, the second conductive type semiconductor layer 116 may be realized as a p-type semiconductor layer. The p-type semiconductor layer may be formed of a semiconductor material having a composition formula of $In_xAl_yGa_{1-x-y}N$ ($0 \leq x \leq 1$, $0 \leq y \leq 1$, $0 \leq x+y \leq 1$), e.g., one of InAlGaN, GaN, AlGaN, AlInN, InGaN, AlN, and InN. The p-type semiconductor layer may be doped with a p-type dopant such as Mg, Zn, Ca, Sr, or Ba.

An n-type or p-type semiconductor layer may be further formed on the second conductive type semiconductor layer 116. Thus, the light emitting structure 110 may have one of an np junction structure, a pn junction structure, an npn structure, and a pnp structure, but is not limited thereto.

According to the current embodiment, the rare-earth element may be added to the buffer layer 105 to allow the buffer layer 105 to have band gap energy less than that of the light emitting structure 110.

Particularly, since the light emitting structure 110 is formed of an AlInGaN-based compound semiconductor material, the light emitting structure 110 may have band gap energy of about 3.4 eV. The buffer layer 105 may have band gap energy of about 1.8 eV to about 2.5 eV by doping the rare-earth element into the AlInGaN-based compound semiconductor material. That is, since the buffer layer 105 contains the rare-earth element even though the buffer layer 105 and the light emitting structure 110 are formed of the same compound semiconductor material, the buffer layer 105 may have band gap energy less than that of the light emitting structure 110.

For example, when the buffer layer 105 is formed as a GaN layer and Eu of the rare-earth element is doped into the GaN layer, the buffer layer 105 may have band gap energy of about 2.0 eV.

Figure 3:
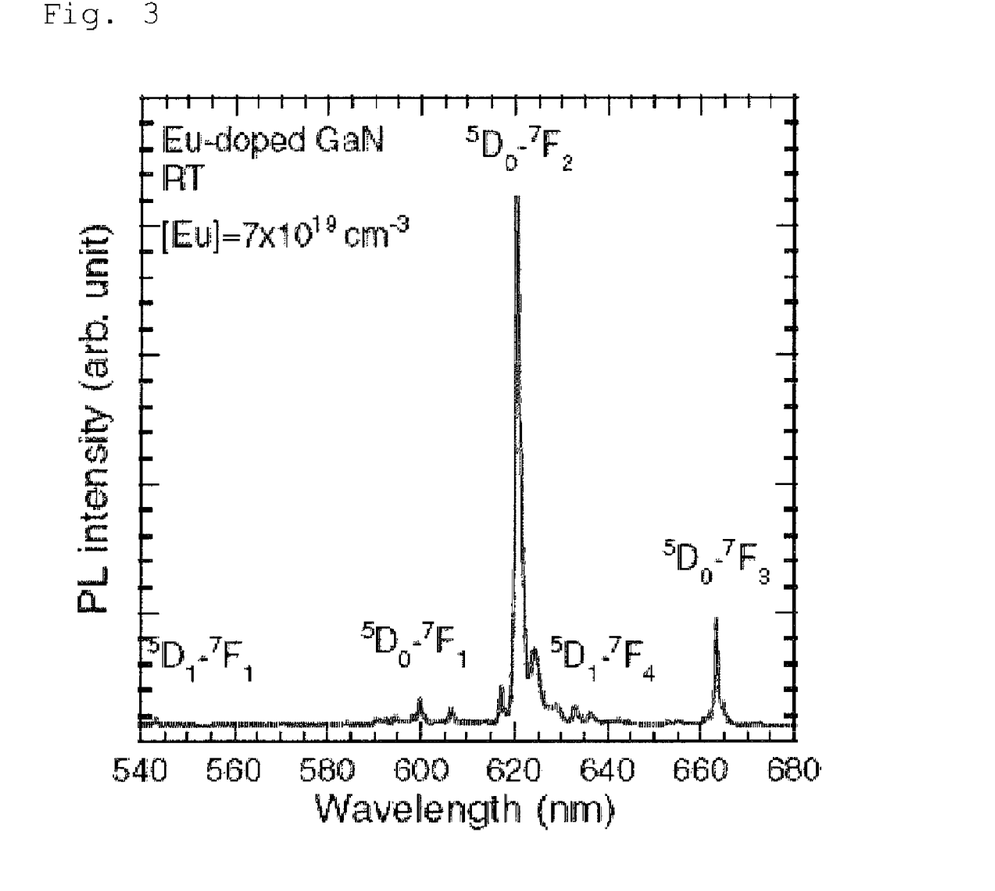
FIG. 3 is a graph of experimental results obtained by measuring a photoluminescence (PL) spectrum of a GaN layer in which Eu is doped.

FIG. 3 is a graph of experimental results obtained by measuring a photoluminescence (PL) spectrum of a GaN layer in which Eu is doped. The graph shows PL intensity according to a wavelength (nm).

Referring to FIG. 3, it is seen that the GaN layer in which the Eu is doped has the largest PL intensity at about 620 nm. Also, when $\lambda=620$ nm is applied to the following equation represented as a relationship between a wavelength and energy, it is seen that the GaN layer in which the Eu is doped has band gap energy of about 2.0 eV.

$$E[eV] = 1239.8/\lambda \quad \text{(Eq 1)}$$

According to the current embodiment, since the buffer layer 105 has band gap energy less than that of the light emitting structure 110, the buffer layer 105 may effectively absorb energy of a laser used in a laser lift off (LLO) process that will be described below. In addition, since the buffer layer 105 has band gap energy of about 1.8 eV to about 2.5 eV, a long wavelength laser having a wavelength of greater than at least about 320 nm may be used as the laser in the LLO process. Thus, the LLO process may be efficiently performed when compared to a short wavelength laser.

For example, the buffer layer 105 may have a thickness of about 0.1 nm to about 1 μm to secure reliability of the LLO process.

Figure 4:
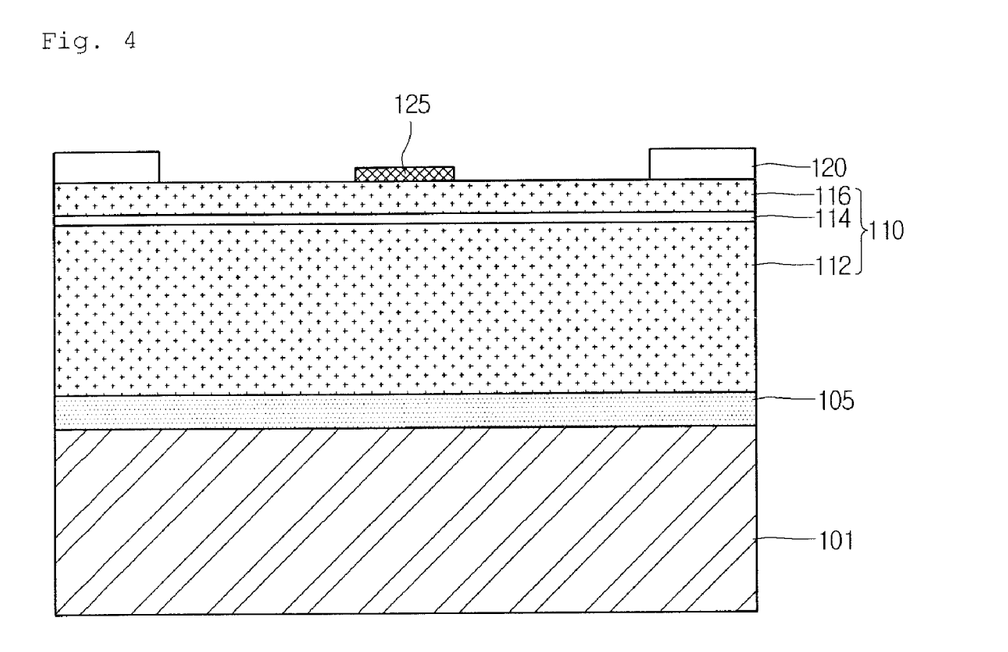

Referring to FIG. 4, a channel layer 120 and a current blocking layer 125 may be formed on the second conductive type semiconductor layer 116 of the light emitting structure 110.

The channel layer 120 may prevent the light emitting structure 110 from being electrically shorted with a first electrode layer (that will be described below) to improve reliability of the process for fabricating the light emitting device. The channel layer 120 may be called as an isolation layer.

The channel layer 120 may be formed around a top surface of the second conductive type semiconductor layer 116. That is, the channel layer 120 may have a ring shape, a loop shape, or a frame shape. Also, the channel layer may be formed using various deposition processes such as sputtering process, E-beam deposition process, and plasma enhanced chemical vapor deposition (PECVD) process.

For example, the channel layer 120 may be formed of a material having electrical insulation or a material having conductivity less than that of the light emitting structure 110. For example, the channel layer 120 may be formed of oxide or nitride. For example, the channel layer 120 may be formed of at least one of the group consisting of $SiO_2$, $Si_xO_y$, $Si_3N_4$, $Si_xN_y$, $SiO_xN_y$, $Al_2O_3$, $TiO_2$, ITO, AZO, and ZnO using the deposition process, but is not limited thereto.

At least one portion of the current blocking layer (CBL) 125 may vertically overlap a second electrode layer that will be described below. Thus, a phenomenon in which a current is concentrated into the shortest distance between the second electrode layer and the first electrode layer may be reduced to improve the light emitting efficiency of the light emitting device according to the current embodiment.

The CBL 125 may be formed of a material having electrical insulation or a material schottky-contacting the second conductive type semiconductor layer 116. The CBL 125 may be formed of oxide, nitride, or a metal. For example, the CBL 125 may be formed of at least one of $SiO_2$, $SiO_x$, $SiO_xN_y$, $Si_3N_4$, $Al_2O_3$, $TiO_x$, Ti, Al, and Cr.

Figure 5:
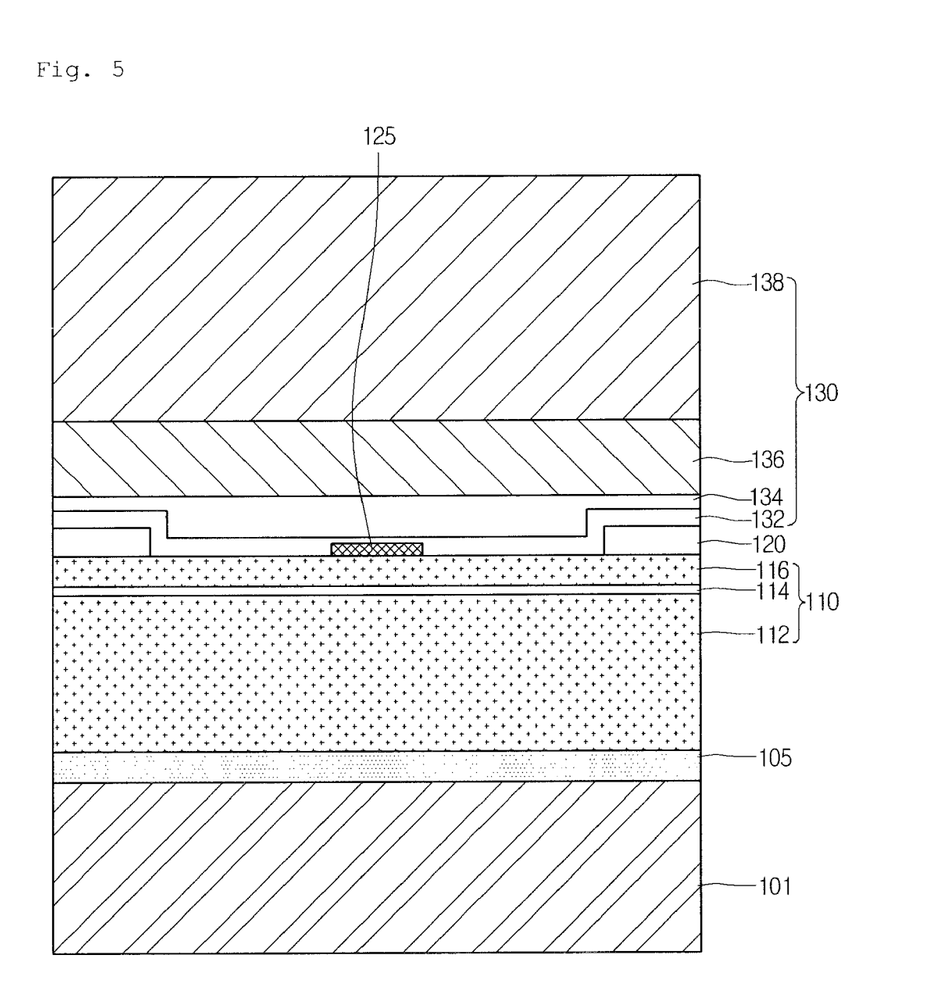

Referring to FIG. 5, the first electrode layer 130 may be formed on the channel layer 120 and the current blocking layer 125.

As shown in FIG. 5, for example, the first electrode layer 130 may comprise an ohmic layer 132, a reflective layer 134, an adhesion metal layer 136, and a conductive support member 138.

The ohmic layer 132 may form ohmic-contact between the first electrode layer 130 that is a metal material and the second conductive type semiconductor layer 116 that is a semiconductor material to allow a current to smoothly flow between the first electrode layer 130 and the second conductive type semiconductor layer 116.

The ohmic layer 132 may be formed on the second conductive type semiconductor layer 116. Also, a portion of the ohmic layer may be formed on the channel layer 120 and the CBL 125.

For example, the ohmic layer 132 may be formed of indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), and gallium zinc oxide (GZO), IZON (IZO Nitride), ZnO, IrOx, RuOx, and NiO. Also, the ohmic layer 132 may be formed of one of Ag, Ni, Al, Rh, Pd, Ir, Ru, Mg, Zn, Pt, Au, Hf, and combinations thereof. Also, the ohmic layer 132 may have a single or multi-layer structure.

The reflective layer 134 may be formed on the ohmic layer 132. The reflective layer 134 may reflect light incident from the active layer 114 to increase an amount of light extracted to the outside.

The reflective layer 134 may be formed of a metal material having high reflectance, e.g., a metal or alloy containing at least one of Ag, Ni, Al, Rh, Pd, Ir, Ru, Mg, Zn, Pt, Au, Cu, and Hf.

The adhesion metal layer 136 may be formed on the reflective layer 134. The adhesion metal layer may improve an adhesion force of an interface between the conductive support member 138 and the reflective layer 134.

The adhesion metal layer 136 may be formed of a barrier metal or bonding metal. For example, the adhesion metal layer 136 may be formed of at least one of Ti, Au, Sn, Ni, Cr, Ga, In, Cu, Ag, and Ta.

The conductive support member 138 may support the light emitting device according to an embodiment and be connected to an external electrode to provide a power to the light emitting structure 110.

For example, the conductive support member 138 may be formed of at least one of Ti, Cr, Ni, Al, Pt, Au, W, Cu, Mo, Cu—W and a carrier wafer (e.g., Si, Ge, GaAs, ZnO, SiC, SiGe, or etc) that is a semiconductor substrate in which impurities are added. Also, the conductive support member 138 may be varied in thickness according to a design of the light emitting device. For example, the conductive support member 138 may have a thickness of about 30 µm to about 500 µm.

Figure 6:
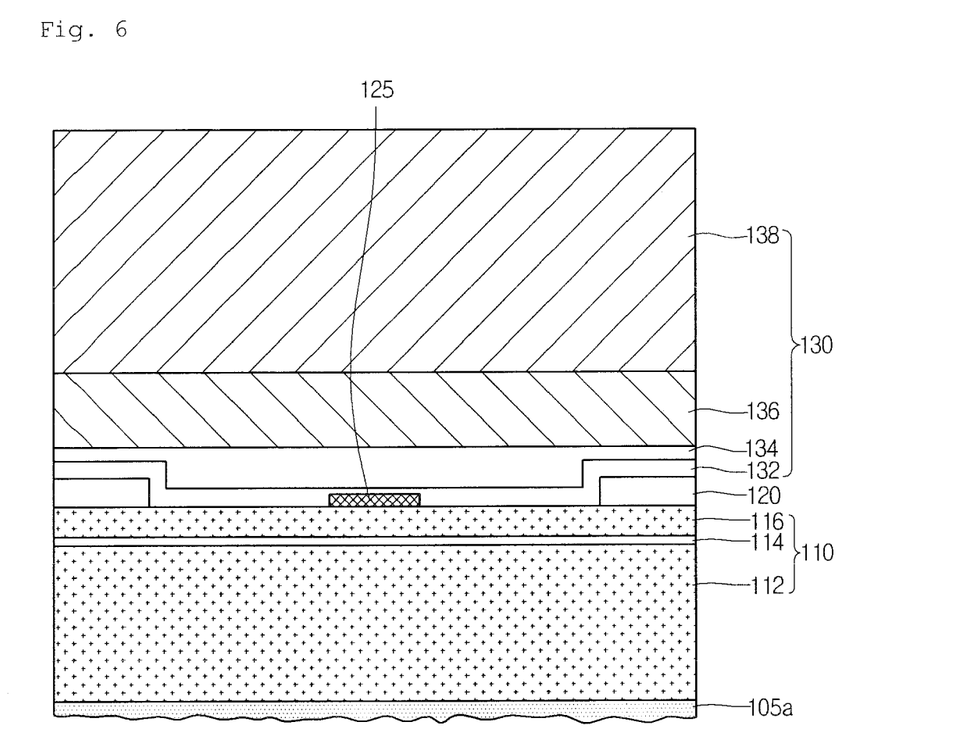

Referring to FIGS. 5 and 6, the substrate 101 may be removed.

In the current embodiment, the substrate 101 may be removed through the LLO process. The LLO process is a process in which a laser is irradiated onto a bottom surface of the substrate 101 to exfoliate the substrate 101 from the light emitting structure 110.

Since the buffer layer 105 has band gap energy of about 1.8 eV to about 2.3 eV less than that of the light emitting structure 110 in the current embodiment, the laser irradiated onto the bottom surface of the substrate 101 may be at least long wavelength laser having a wavelength of greater than about 320 nm. The long wavelength laser may have a low cost and easily control a power to improve yield and effectiveness of the LLO process when compared to an excimer laser having a short wavelength of about 248 nm.

The energy of the laser irradiated onto the bottom surface of the substrate 101 may be absorbed by the buffer layer 105. Thus, the substrate 101 and the light emitting structure 110 may be exfoliated from each other while the buffer layer 105 is dissolved.

Figure 7:
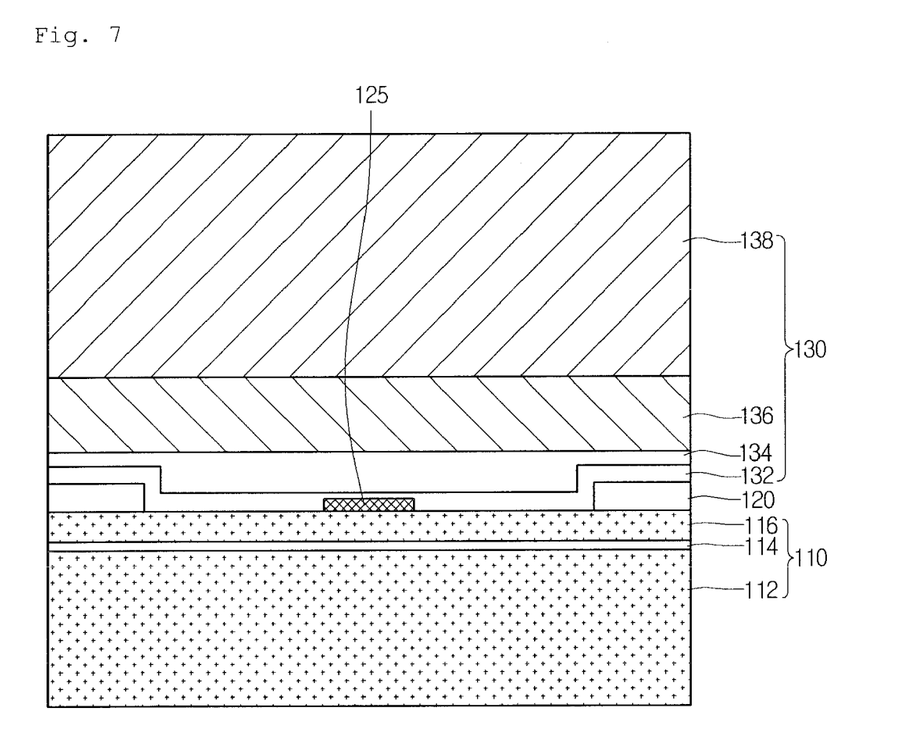

Referring to FIGS. 6 and 7, a buffer layer 105a remaining after the LLO process is performed may be removed.

For example, the buffer layer 105a may be removed by a wet etching process, but is not limited thereto. Also, a portion of the first conductive type semiconductor layer 112 may be removed.

Figure 8:
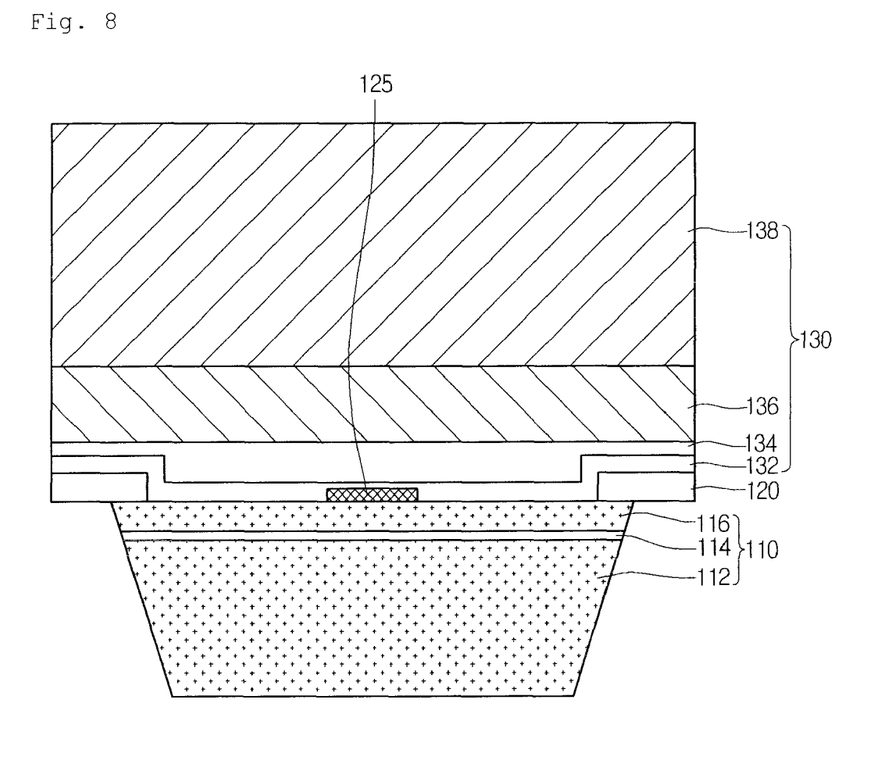

Referring to FIG. 8, an isolation etching process may be performed along a boundary of an individual chip of the light emitting structure 110 to divide a plurality of light emitting devices into individual light emitting device unit.

For example, the isolation etching process may be performed by a dry etching process such as an inductively coupled plasma (ICP) process, but is not limited thereto.

Figure 9:
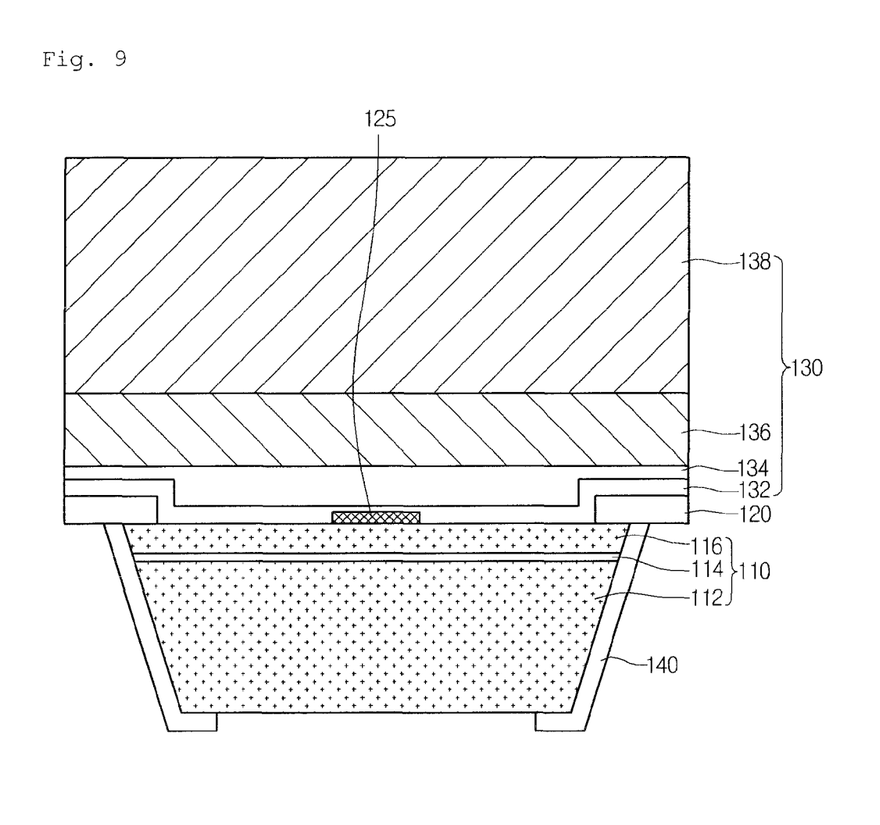

Referring to FIG. 9, a passivation layer 140 may be formed on at least side surface of the light emitting structure 110.

The passivation layer 140 may prevent the light emitting structure 110 from being electrically shorted with the external electrode or the first electrode layer 130.

The passivation layer 140 may be formed of oxide or nitride. For example, the passivation layer 140 may be formed of a light-transmitting and insulating material such as $SiO_2$, $SiO_x$, $SiO_xN_y$, $Si_3N_4$, or $Al_2O_3$. For example, the passivation layer 140 may be formed using a deposition process such as an E-beam deposition process, a PECVD process, or a sputtering process.

Figure 10:
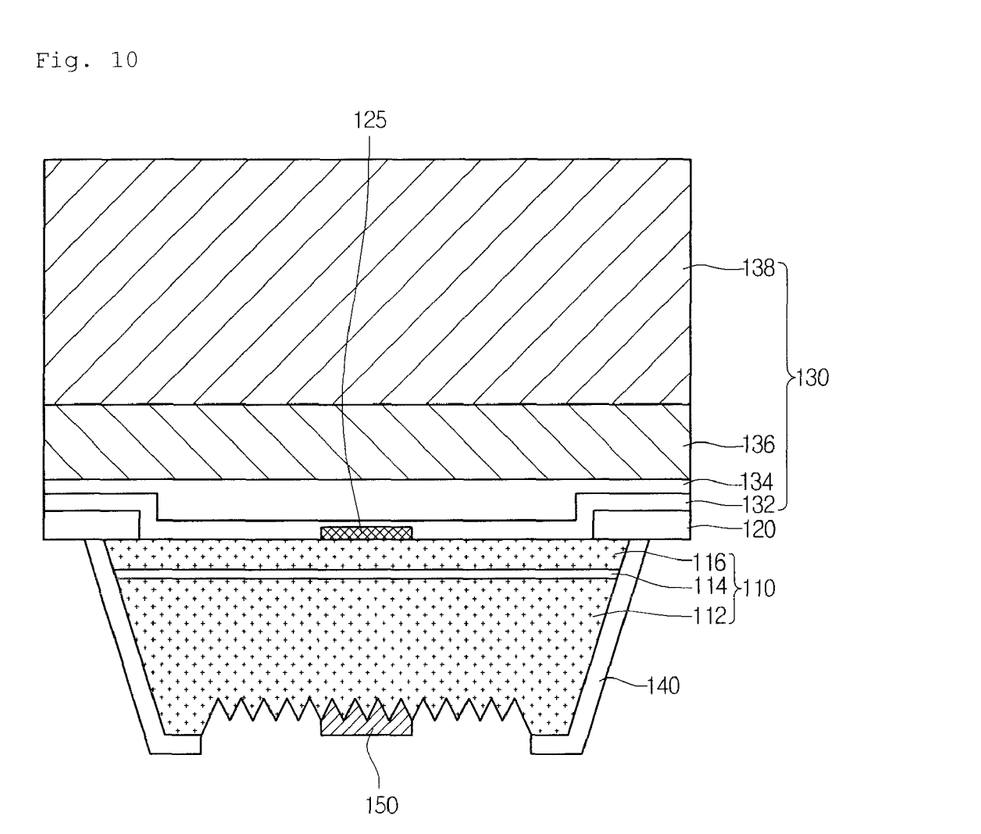

Referring to FIG. 10, the second electrode layer 150 may be formed under the first conductive type semiconductor layer 112 of the light emitting structure 110 to provide the light emitting device according to an embodiment.

The second electrode 150 together with the first electrode layer 130 may provide a power to the light emitting structure 110. Also, at least one portion of the second electrode layer 150 may vertically overlap the CBL 125.

The second electrode layer 150 may be formed of at least one of Cu, Au, Ag, Al, Ni, Mo, Pt, Pd, Ti, Sn, and Cr and a single or multi-layer structure.

A light extraction pattern may be formed on a bottom surface of the light emitting structure 110. The light extraction pattern may be a random roughness formed by a wet etching process or a photonic crystal pattern formed by a patterning process, but is not limited thereto.

<Light Emitting Device Package>

Figure 11:
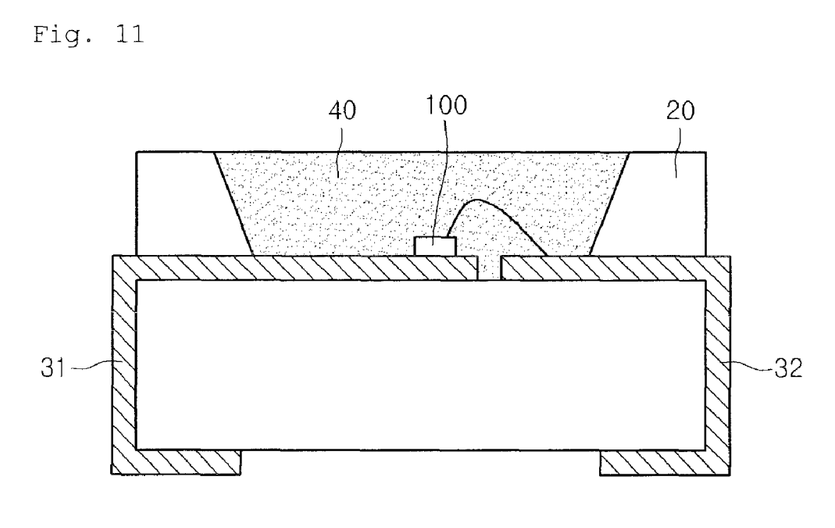
FIG. 11 is a sectional view of a light emitting device package comprising a light emitting device according to an embodiment.

FIG. 11 is a sectional view of a light emitting device package comprising a light emitting device according to an embodiment.

Referring to FIG. 11, a light emitting device package according to an embodiment may comprise a body 20, first and second lead electrodes 31 and 32 disposed on the body 20, a light emitting device 100 according to an embodiment, which is disposed on the body 20 and electrically connected to the first and second lead electrodes 31 and 32, and a molding member 40 surrounding the light emitting device 100.

The body 20 may be formed of a silicon material, a synthetic resin material, or a metal material. Also, an inclined surface may be disposed around the light emitting device 100.

The first and second lead electrodes 31 and 32 are electrically separated from each other and supply a power to the light emitting device 100. Also, the first and second lead electrodes 31 and 32 may reflect light generated in the light emitting device 100 to improve light efficiency. In addition, the first and second lead electrodes 31 and 32 may dissipate heat generated in the light emitting device 100 to the outside.

The light emitting device 100 may be disposed on the body 20 or any one of the first and second lead electrodes 31 and 32.

The light emitting device 100 may be electrically connected to the first and second lead electrodes 31 and 32 through one of a wiring process, a flip-chip process, and a die bonding process.

The molding member 40 may surround the light emitting device 100 to protect the light emitting device 100. Also, the molding member 40 may contain a phosphor to vary a wavelength of light emitted from the light emitting device 100.

The light emitting device or the light emitting device package according to an embodiment may be provided in plurality. Thus, the plurality of light emitting devices or light emitting device packages may be arrayed on a board. Also, optical members such as a lens, a light guide plate, a prism sheet, and a diffusion sheet may be disposed on an optical path of the light emitting device package. The light emitting device package, the board, and the optical members may function as a light unit. The light unit may be classified into a top view or side view type. Also, the light unit may be provided to display devices such as portable terminals and laptop computers or variously applied to lighting devices and indicating devices. According to another embodiment, the light unit may be realized as the lighting device comprising the semiconductor light emitting device or the light emitting device package according to the above-described embodiments. For example, the lighting device may comprise lamps, streetlights, scoreboards, and fluorescent lamps.

Figure 12:
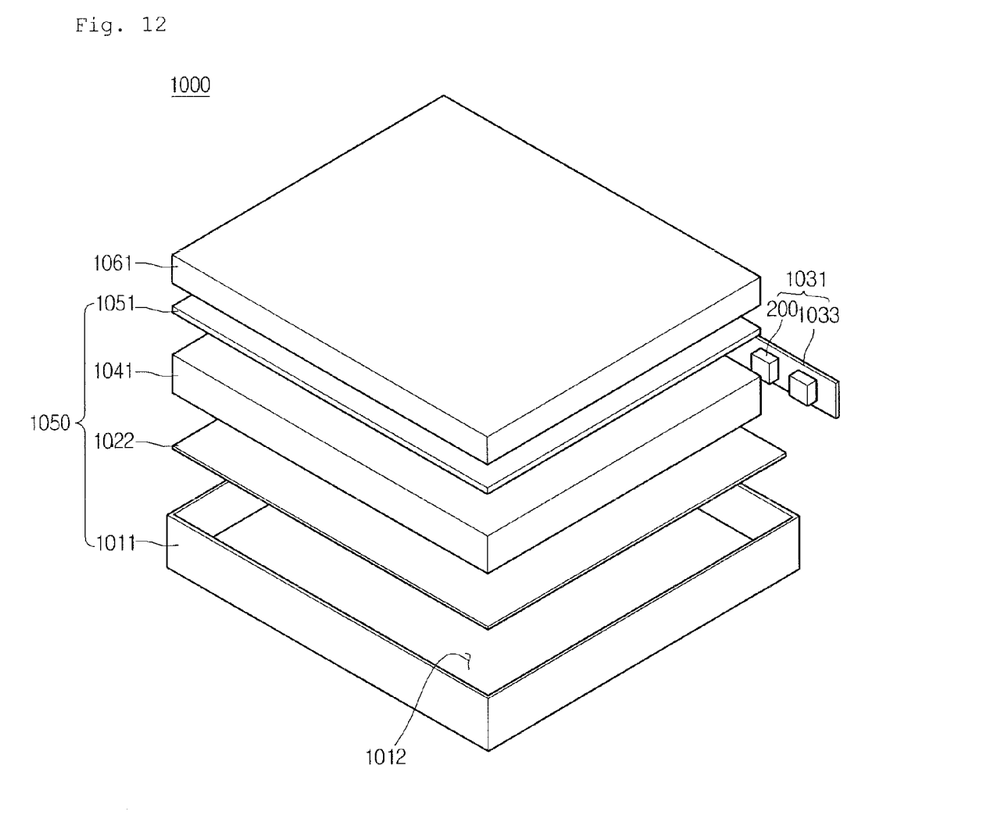
FIG. 12 is a perspective view illustrating an example of a display device according to an embodiment.

The light emitting device according to an embodiment may be applied to a light unit. The light unit has a structure in which a plurality of light emitting device is arrayed. That is, the light unit may comprise a display device of FIGS. 12 and 13 and a lighting device of FIG. 14. FIG. 12 is an exploded perspective view of a display device according to an embodiment.

Referring to FIG. 12, a display device 1000 according to an embodiment may comprise a light guide plate 1041, a light emitting module 1031 providing light to the light guide plate 1041, a reflective member 1022 disposed under the light guide plate 1041, an optical sheet 1051 disposed on the light guide plate 1041, a display panel 1061 disposed on the optical sheet 1051, and a bottom cover 1011 receiving the light guide plate 1041, the light emitting module 1031, and the reflective member 1022, but is not limited thereto.

The bottom cover 1011, the reflective member 1022, the light guide plate 1041, and the optical sheet 1051 may be defined as a light unit 1050.

The light guide plate 1041 diffuses light to produce planar light. The light guide plate 1041 may be formed of a transparent material. For example, the light guide plate 1041 may be formed of one of an acrylic resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

The light emitting module 1031 may provide light to at least one side surface of the light guide plate 1041. Thus, the light emitting module 1031 may act as a light source of a display device.

At least one light emitting module 1031 may be disposed to directly or indirectly provide light to at least one side surface of the light guide plate 1041. The light emitting module 1031 may comprise a board 1033 and the light emitting device 200 according to the above-described embodiment. The light emitting device 200 may be arrayed on the board 1033 by a predetermined distance.

The board 1033 may be a printed circuit board (PCB) having a circuit pattern. Also, the substrate 1033 may comprise a general PCB, a metal core PCB, and a flexible PCB, but is not limited thereto. When the light emitting device 200 are mounted on a side surface of the bottom cover 1011 or on a heatsink plate, the board 1033 may be removed. Here, a portion of the heatsink plate may contact a top surface of the bottom cover 1011.

The plurality of light emitting devices 200 may be mounted on the board 1033 to allow a light emitting surface through which light is emitted to be spaced a predetermined distance from the light guide plate 1041, but is not limited thereto. The light emitting device 200 may directly or indirectly provide light to a light incident surface that is a side surface of the light guide plate 1041, but is not limited thereto.

The reflective member 1022 may be disposed under the light guide plate 1041. Since the reflective member 1022 reflects light incident onto an under surface of the light guide plate 1041 to supply the reflected light upward, brightness of the light unit 1050 may be improved. For example, the reflective member 1022 may be formed of one of PET, PC, and PVC, but is not limited thereto. The reflective member 1022 may be the top surface of the bottom cover 1011, but is not limited thereto.

The bottom cover 1011 may receive the light guide plate 1041, the light emitting module 1031, and the reflective member 1022. For this, the bottom cover 1011 may comprise a receiving part 1012 having a box shape with an opened upper side, but is not limited thereto. The bottom cover 1011 may be coupled to a top cover, but is not limited thereto.

The bottom cover 1011 may be formed of a metal material or a resin material. Also, the bottom cover 1011 may be manufactured using a press molding process or an extrusion molding process. The bottom cover 1011 may be formed of a metal or non-metal material having superior heat conductivity, but is not limited thereto.

For example, the display panel 1061 may be a liquid crystal display (LCD) panel and comprise first and second substrates formed of a transparent material and facing each other and a liquid crystal layer between the first and second substrates. A polarizing plate may be attached to at least one surface of the display panel 1061. The present disclosure is not limited to the attached structure of the polarizing plate. The display panel 1061 displays information using light transmitting the optical sheet 1051. The display device 1000 may be applied to various portable terminals, monitors for notebook computers, monitors for laptop computers, televisions, etc.

The optical sheet 1051 is disposed between the display panel 1061 and the light guide plate 1041 and comprises at least one light-transmitting sheet. For example, the optical sheet 1051 may comprise at least one of a diffusion sheet, horizontal and vertical prism sheets, a brightness enhanced sheet, etc. The diffusion sheet diffuses incident light, and the horizontal or/and vertical prism sheet(s) collect(s) the incident light into a display region. In addition, the brightness enhanced sheet reuses lost light to improve the brightness. Also, a protection sheet may be disposed on the display panel 1061, but is not limited thereto.

Here, optical members such as the light guide plate 1041 and the optical sheet 1051 may be disposed on an optical path of the light emitting module 1031, but is not limited thereto.

Figure 13:
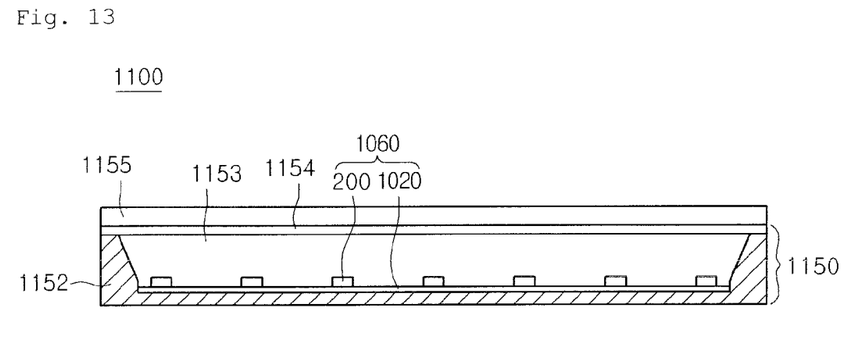
FIG. 13 is a perspective view illustrating another example of the display device according to an embodiment.

FIG. 13 is a perspective view illustrating another example of the display device according to an embodiment.

Referring to FIG. 13, a display device 1100 comprises a bottom cover 1152, a board 1120 on which the above-described light emitting devices 200 are arrayed, an optical member 1154, and a display panel 1155.

The board 1120 and the light emitting device 200 may be defined as a light emitting module 1060. The bottom cover 1152, the at least one light emitting module 1060, and the optical member 1154 may be defined as a light unit.

The bottom cover 1152 may comprise a receiving part 1153, but is not limited thereto.

Here, the optical member 1154 may comprise at least one of a lens, a light guide plate, a diffusion sheet, horizontal and vertical prism sheets, and a bright enhancement sheet. The light guide plate may be formed of a PC material or PMMA material. In this case, the light guide plate may be removed. The diffusion, sheet diffuses incident light, and the horizontal and vertical prism sheets collect the incident light into a display region. The brightness enhanced sheet reuses lost light to improve brightness.

The optical member 1154 is disposed on the light emitting module 1060 to produce planar light using the light emitted from the light emitting module 1060 or diffuse and collect the light emitted from the light emitting module 1060.

Figure 14:
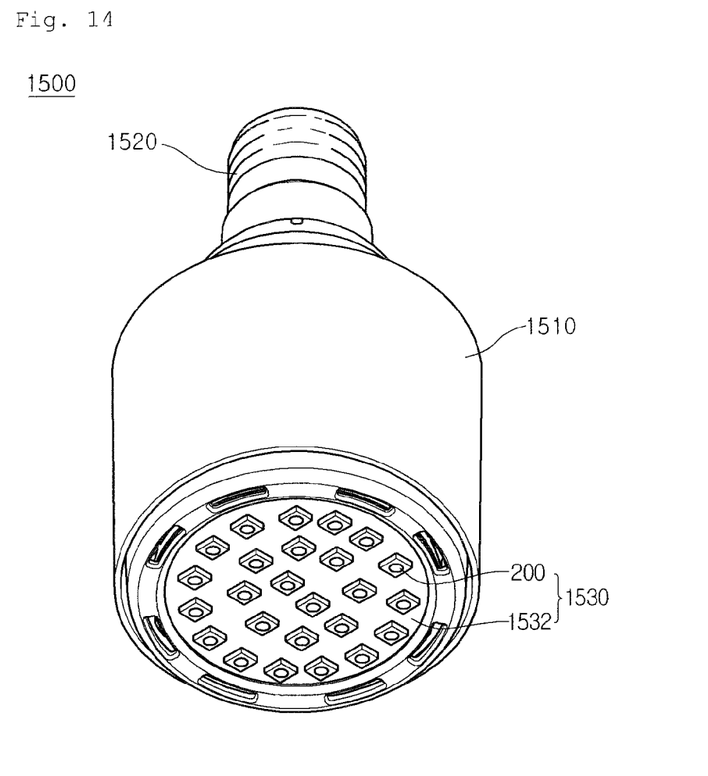
FIG. 14 is a view of a lighting unit according to an embodiment.

FIG. 14 is a view of a lighting unit according to an embodiment.

Referring to FIG. 14, a lighting unit 1500 may comprise a case 1510, a light emitting module 1530 in the case 1510, and a connection terminal 1520 disposed in the case 1510 to receive an electric power from an external power source.

The case 1510 may be preferably formed of a material having good heat dissipation characteristics, for example, a metal material or a resin material.

The light emitting module 1530 may comprise a board 1532 and a light emitting device 200 mounted on the board 1532. The light emitting device 200 may be provided in plurality, and the plurality of light emitting devices 200 may be arrayed in a matrix form or spaced a predetermined distance from each other.

The board 1532 may be an insulator on which a circuit pattern is provided. For example, the board may comprise a general printed circuit board (PCB), a metal core PCB, a flexible PCB, a ceramic PCB, FR-4, etc.

Also, the board 1532 may be formed of a material to efficiently reflect light, and a surface thereof may be formed in a color capable of efficiently reflecting light. For example, the board 1532 may comprise a coated layer having a white color or a silver color.

At least one light emitting device 200 may be mounted on the board 1532. Each of the light emitting devices 200 may comprise at least one light emitting diode (LED) chip. The LED chip may comprise a color LED emitting red, green, blue or white light, and a UV LED emitting ultraviolet (UV) rays.

The light emitting module 1530 may have a combination of several light emitting devices 200 to obtain desired color and luminance. For example, the light emitting module 1530 may have a combination of a white LED, a red LED, and a green LED to obtain a high color rendering index (CRI).

The connection terminal 1520 may be electrically connected to the light emitting module 1530 to supply a power. The connection terminal 1520 may be coupled to an external power source in a socket type, but is not limited thereto. For example, the connection terminal 1520 may be made in a pin type and inserted into the external power source or may be connected to the external power source through a wire.

According to the current embodiment, the light emitting device 200 may be packaged and mounted on the board to realize the light emitting module or mounted in an LED chip form to realize the light emitting module.

Embodiments may provide a light emitting device and a method for fabricating the same.

Embodiment may provide a light emitting device having low costs and improved yield and a method for fabricating the same.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for fabricating a light emitting device, the method comprising:
    forming a buffer layer comprising a compound semiconductor in which a rare-earth element is doped on a substrate;
    forming a light emitting structure comprising a first conductive type semiconductor layer, an active layer, and a second conductive type semiconductor layer, which are successively stacked on the buffer layer;
    forming a first electrode layer on the light emitting structure;
    removing the substrate; and
    forming a second electrode layer under the light emitting structure.

2. The method of claim 1, wherein the buffer layer has band gap energy less than that of the light emitting structure.

3. The method of claim 1, wherein the buffer layer has band gap energy of about 1.8 eV to about 2.3 eV.

4. The method of claim 1, wherein the rare-earth element comprises at least one of Eu, Er, Pr, Tb, Dy, Ce, Sm, Gd, Ho, Yb, Lu, Nd, Pm, and Tm.

5. The method of claim 1, wherein Eu is doped into a GaN-based compound semiconductor to form the buffer layer.

6. The method of claim 1, wherein the buffer layer and the light emitting structure are formed of the same compound semiconductor material.

7. The method of claim 1, wherein the buffer layer has a thickness of about 0.1 nm to about 1 μm.

8. The method of claim 1, wherein the removing of the substrate comprises irradiating a laser onto a bottom surface of the substrate to dissolve the buffer layer, thereby removing the substrate.

9. The method of claim 8, wherein the laser has a wavelength of at least about 320 nm.

10. The method of claim 1, wherein the forming of the first electrode layer comprises:
    forming an ohmic layer on the light emitting structure;
    forming a reflective layer on the ohmic layer; and
    forming a conductive support member on the reflective layer.

11. The method of claim 1, further comprising, after the removing of the substrate, removing the buffer remaining on a bottom surface of the light emitting structure.

* * * * *